United States Patent
Lin et al.

(10) Patent No.: US 7,727,879 B2
(45) Date of Patent: Jun. 1, 2010

(54) METHOD OF FORMING TOP ELECTRODE FOR CAPACITOR AND INTERCONNECTION IN INTEGRATED PASSIVE DEVICE (IPD)

(75) Inventors: Yaojian Lin, Singapore (SG); Robert Charles Frye, Piscataway, NJ (US)

(73) Assignee: STATS ChipPAC, Ltd., Singapore (SG)

( * ) Notice: Subject to any disclaimer, the term of this patent is extended or adjusted under 35 U.S.C. 154(b) by 386 days.

(21) Appl. No.: 11/689,319

(22) Filed: Mar. 21, 2007

(65) Prior Publication Data

US 2008/0233731 A1 Sep. 25, 2008

(51) Int. Cl.
*H01L 21/4763* (2006.01)

(52) U.S. Cl. .................. 438/622; 438/637; 257/E21.59; 257/E23.145

(58) Field of Classification Search .................. 438/622, 438/637, 597; 257/E21.59, E23.145
See application file for complete search history.

(56) References Cited

U.S. PATENT DOCUMENTS

| | | | |
|---|---|---|---|
| 5,370,766 A | 12/1994 | Desaigoudar et al. | |
| 5,446,311 A | 8/1995 | Ewen et al. | |
| 5,478,773 A | 12/1995 | Dow et al. | |
| 6,075,427 A | 6/2000 | Tai et al. | |
| 2003/0109128 A1* | 6/2003 | Koganei | 438/622 |
| 2003/0148558 A1* | 8/2003 | Kubo et al. | 438/128 |

* cited by examiner

*Primary Examiner*—Asok K Sarkar
*Assistant Examiner*—Julia Slutsker
(74) *Attorney, Agent, or Firm*—Robert D. Atkins (57) ABSTRACT

A method of manufacturing a semiconductor device includes providing a substrate having a first conductive layer disposed on a top surface of the substrate. A high resistivity layer is formed over the substrate and the first conductive layer. A dielectric layer is deposited over the substrate, first conductive layer and high resistivity layer. A portion of the dielectric layer, high resistivity layer, and first conductive layer forms a capacitor stack. A first passivation layer is formed over the dielectric layer. A second conductive layer is formed over the capacitor stack and a portion of the first passivation layer. A first opening is etched in the dielectric layer to expose a surface of the high resistivity layer. A third and fourth conductive layer is deposited over the first opening in the dielectric layer and a portion of the first passivation layer.

25 Claims, 14 Drawing Sheets

METHOD OF FORMING TOP ELECTRODE FOR CAPACITOR AND INTERCONNECTION IN INTEGRATED PASSIVE DEVICE (IPD)

FIELD OF THE INVENTION

The present invention relates in general to semiconductor devices and, more particularly, to an apparatus and method of fabricating a capacitor device and interconnection structures in an integrated passive device (IPD).

BACKGROUND OF THE INVENTION

Semiconductors, or computer chips, are found in virtually every electrical product manufactured today. Chips are used not only in very sophisticated industrial and commercial electronic equipment, but also in many household and consumer items such as televisions, clothes washers and dryers, radios, and telephones. As products become smaller but more functional, there is a need to include more chips in the smaller products to perform the functionality. The reduction in size of cellular telephones is one example of how more and more capabilities are incorporated into smaller and smaller electronic products.

As electrical devices become increasingly miniaturized, technologies have combined integrated circuit (IC) manufacturing techniques with traditional electrical circuit components to form such components as capacitors, resistors, filters, and interconnects directly upon a silicon or silicon-like substrate. For example, most of the devices in today's portable wireless products are passive components, and the integration of passive components into a substrate or a separate device can provide significant performance, cost, and size advantages.

Figure 1:
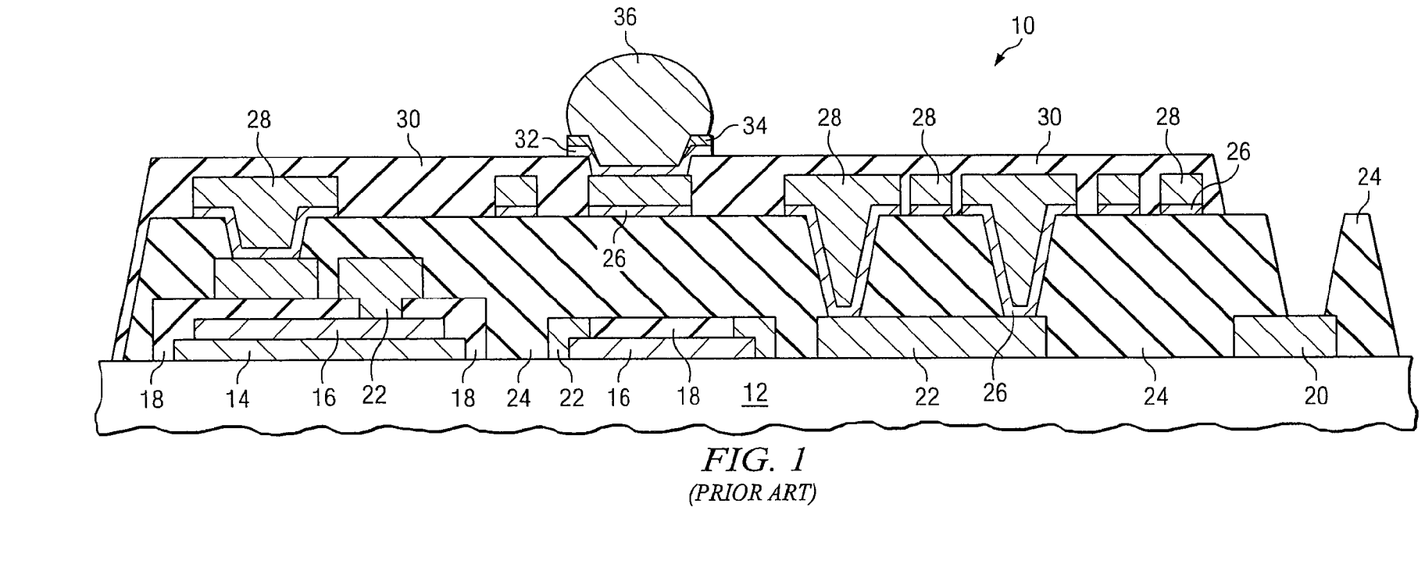
FIG. 1 illustrates an example prior art semiconductor device.
Figure 2A:
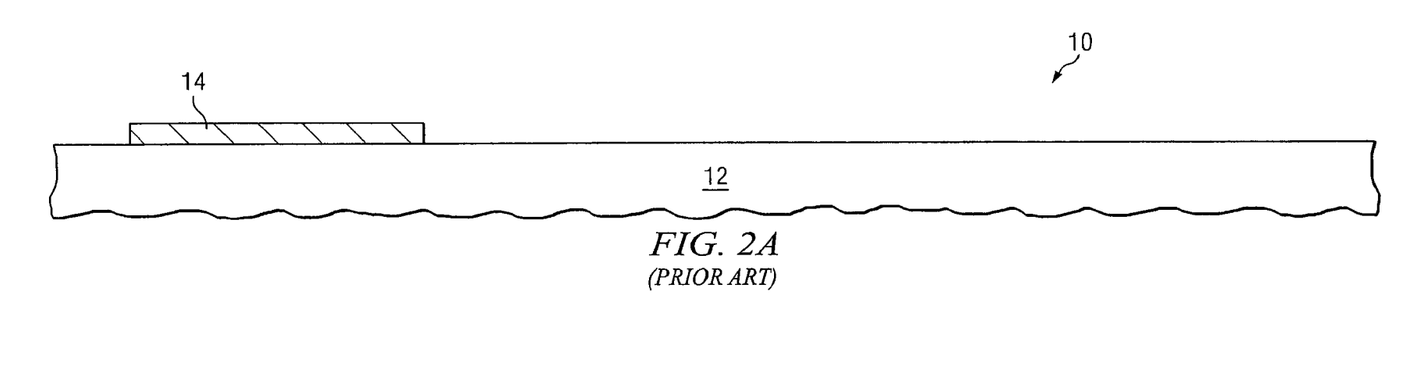
FIG. 2A illustrates a first step in an example prior art method of manufacturing an embodiment of a semiconductor device.
Figure 2B:
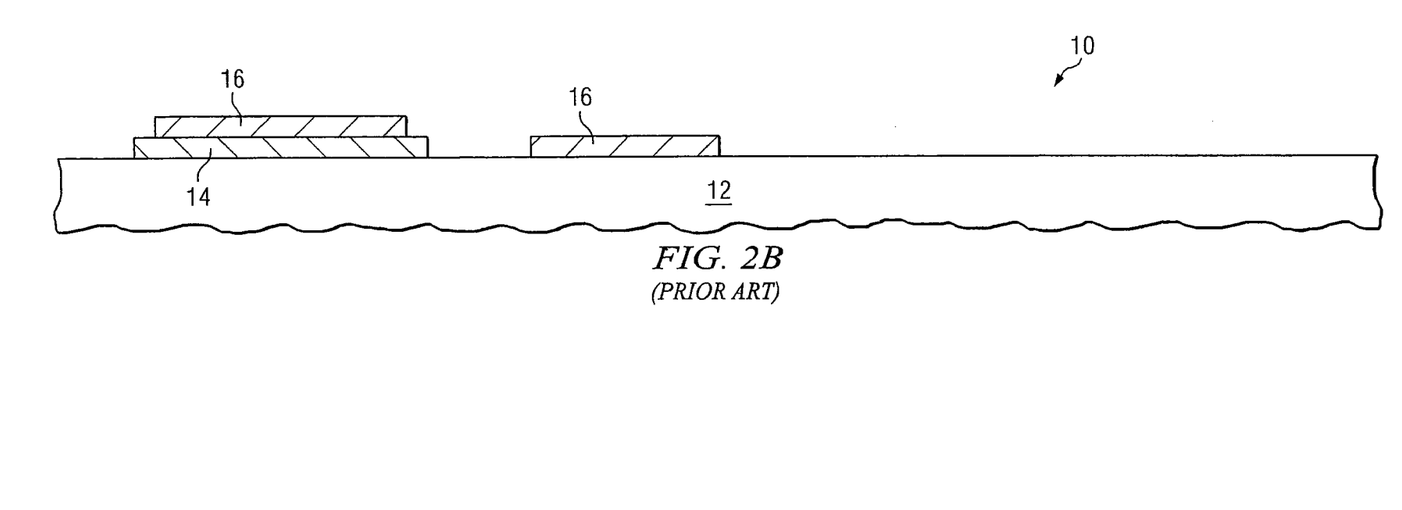
FIG. 2B illustrates a second step in the prior art method of manufacturing began with FIG. 2A.
Figure 2C:
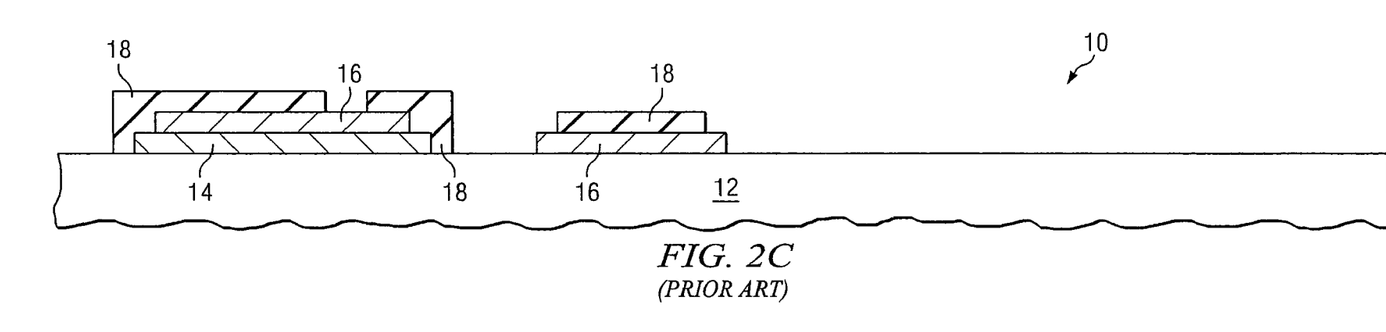
FIG. 2C illustrates a third step in the prior art method of manufacturing began with FIG. 2A.

A typical such semiconductor device 10 having an integrated capacitor device is shown in FIG. 1. A process for fabricating device 10 is depicted in FIGS. 2A-2I. Device 10 includes a substrate 12 and a first conductive layer 14 disposed over the substrate (FIG. 2A). A high resistivity layer 16 is disposed over a portion of the substrate 12 and first conductive layer 14 as shown (FIG. 2B). A dielectric layer 18 is disposed over the high resistivity layers (FIG. 2C).

Figure 2D:
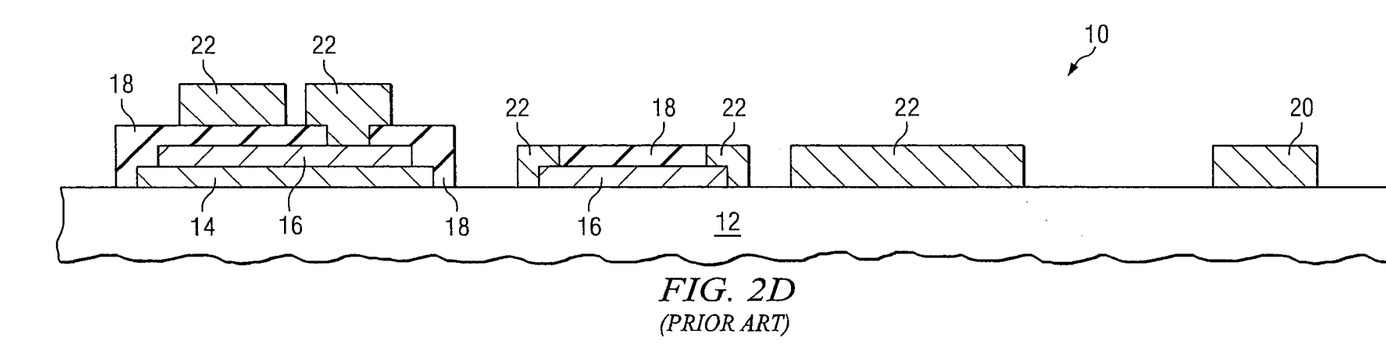
FIG. 2D illustrates a fourth step in the prior art method of manufacturing began with FIG. 2A.
Figure 2E:
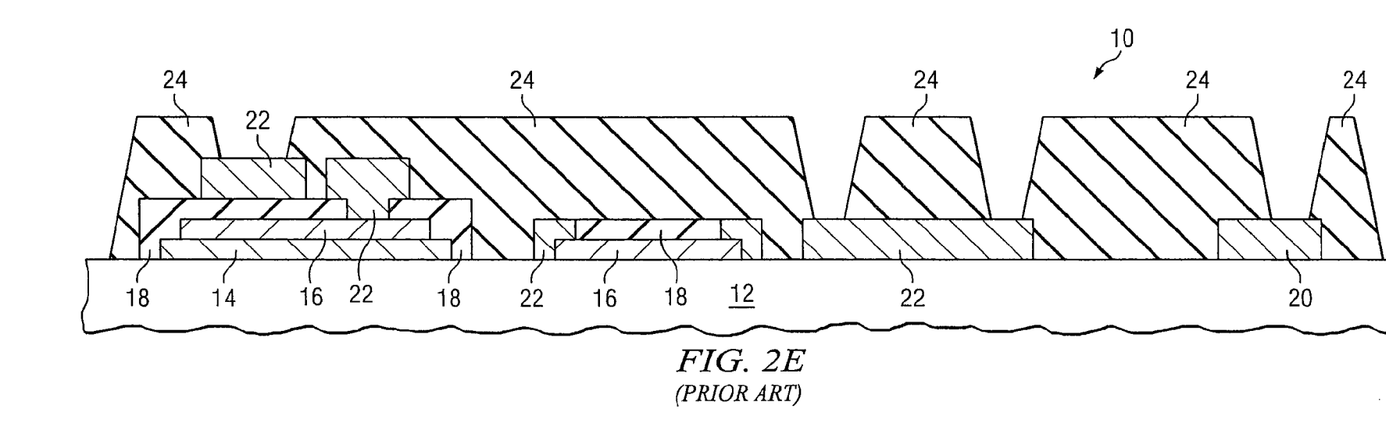
FIG. 2E illustrates a fifth step in the prior art method of manufacturing began with FIG. 2A.
Figure 2F:
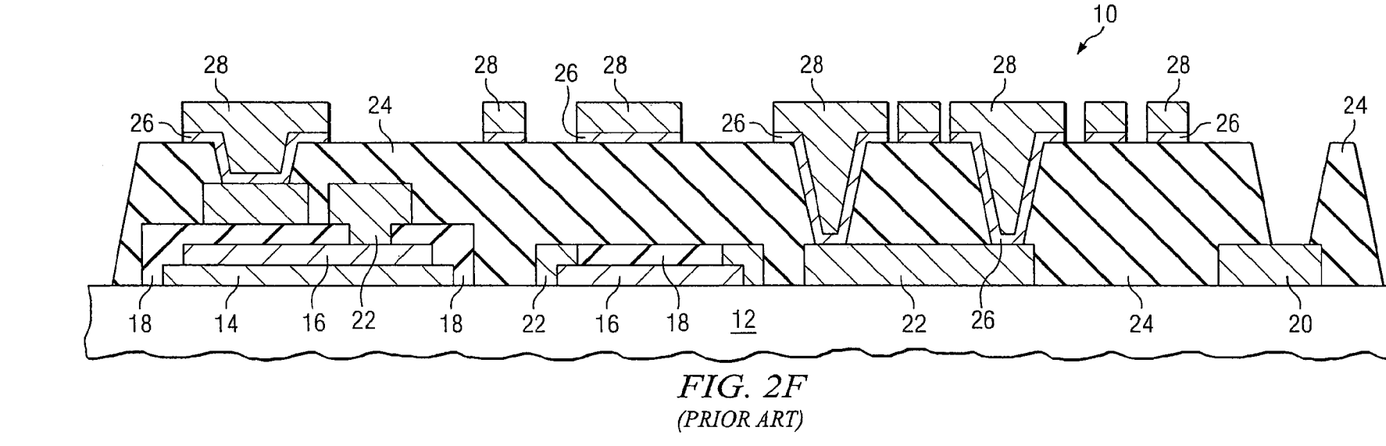
FIG. 2F illustrates a sixth step in the prior art method of manufacturing began with FIG. 2A.
Figure 2G:
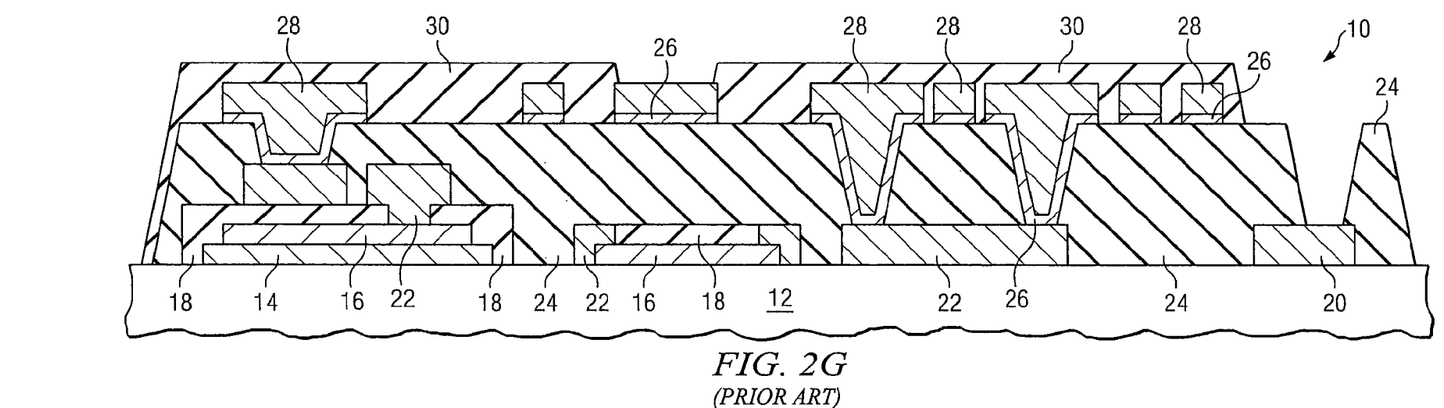
FIG. 2G illustrates a seventh step in the prior art method of manufacturing began with FIG. 2A.
Figure 2H:
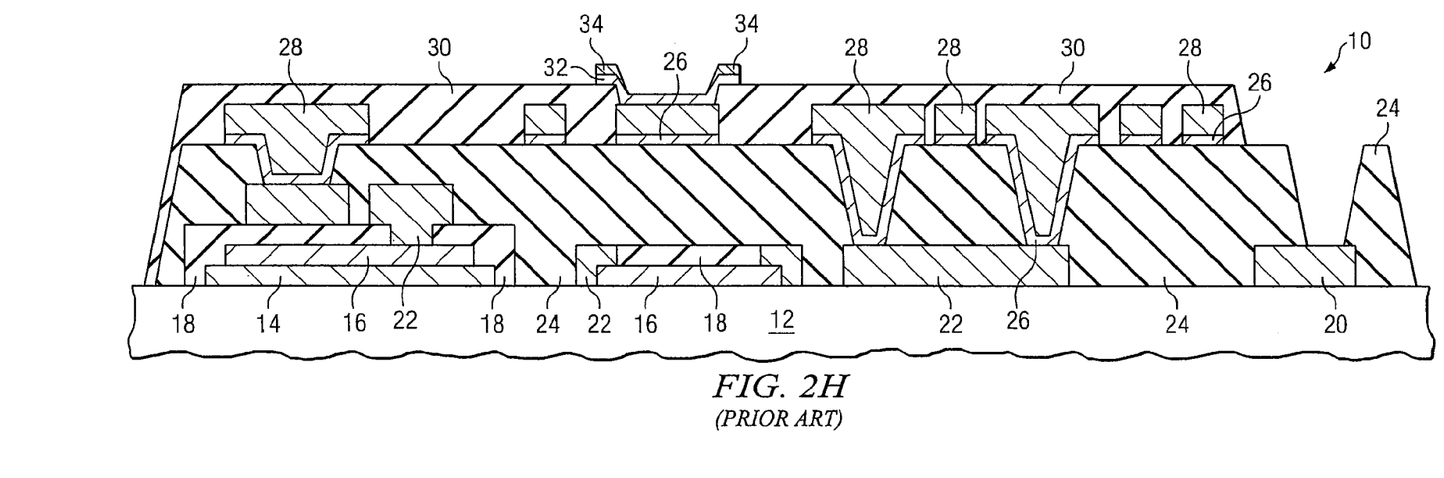
FIG. 2H illustrates an eighth step in the prior art method of manufacturing began with FIG. 2A.
Figure 2I:
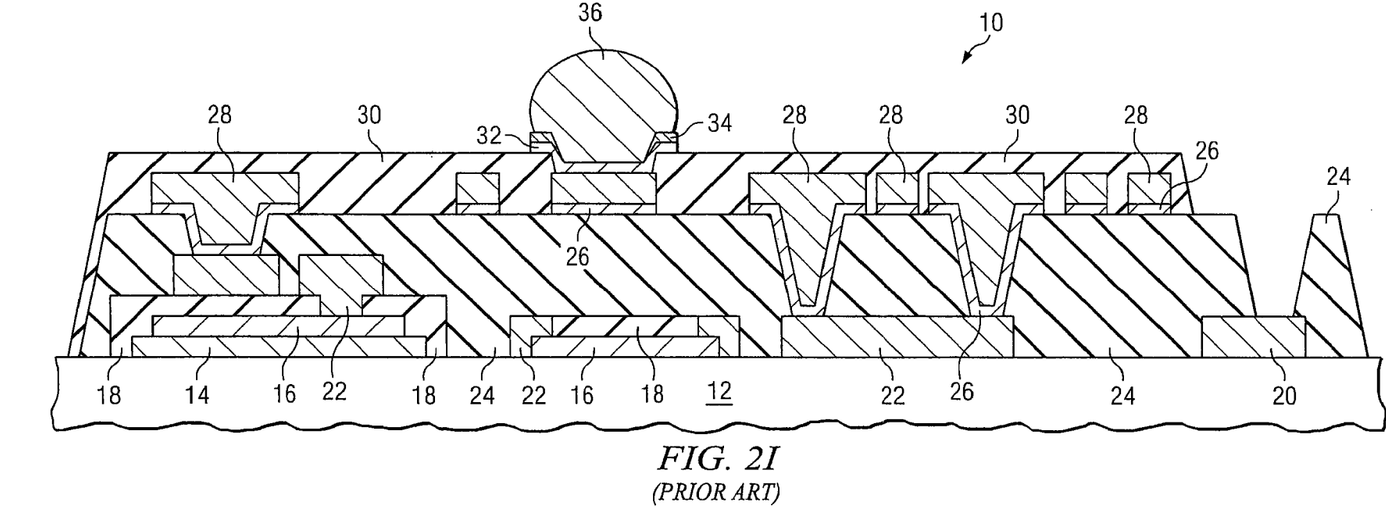
FIG. 2I illustrates a final, ninth step in the prior art method of manufacturing began with FIG. 2A.

As a next step, a second conductive layer 22 is formed over the dielectric layer 18. A wire bond (WB) pad 20 is formed on the substrate (FIG. 2D). A first passivation layer 24 is formed as shown (FIG. 2E). A third and fourth conductive layer 26 and 28 are then disposed over the passivation layer 24 as shown (FIG. 2F). A second passivation layer 30 is then formed over the layers 26 and 28 (FIG. 2G). Fifth and sixth conductive layers 32 and 34 are formed (FIG. 2H). A solder bump 36 is then deposited on the layer 34 (FIG. 2I).

In the depicted process, the second conductive layer 22 is used as a top electrode of the capacitor device, which is patterned before the deposition of the first passivation layer 24. A wet etching process is used for patterning the layer 22. The wet etching process is generally not uniform, making critical dimension (CD) control a potentially serious manufacturing issue when patterning layer 22.

As a result, a lack of uniformity and potential over/under etching will effect the capacitance characteristics of the capacitor device, resulting in non-uniform specifications of the capacitor device. The center frequency of a filter having such a capacitor device is necessarily affected.

SUMMARY OF THE INVENTION

A need exists for a method of forming a semiconductor device having an integrated capacitor device with better controlled capacitance and corresponding increased uniformity and repeatability. In addition, a need exists for manufacturing techniques for the semiconductor device as described which reduce process steps, resulting in shorter cycle time and lower cost.

In one embodiment, the present invention is a method of manufacturing a semiconductor device, comprising providing a substrate having a first conductive layer disposed on a top surface of the substrate, forming a high resistivity layer over the substrate and the first conductive layer, depositing a dielectric layer over the substrate, first conductive layer and high resistivity layer, wherein a portion of the dielectric layer, high resistivity layer, and first conductive layer forms a capacitor stack, forming a first passivation layer over the dielectric layer, forming a second conductive layer over the capacitor stack and a portion of the first passivation layer, etching a first opening in the dielectric layer to expose a surface of the high resistivity layer, depositing a third and fourth conductive layer over the first opening in the dielectric layer and a portion of the first passivation layer, and depositing a second passivation layer over a portion of the fourth conductive layer, the second passivation layer having a first opening to expose a surface of the fourth conductive layer.

In another embodiment, the present invention is a semiconductor device, comprising a substrate having a first conductive layer disposed on a top surface of the substrate, a high resistivity layer formed over the substrate and the first conductive layer, a dielectric layer deposited over the substrate, first conductive layer and high resistivity layer, wherein a portion of the dielectric layer, high resistivity layer, and first conductive layer forms a capacitor stack, a first passivation layer formed over the dielectric layer, a second conductive layer formed over the capacitor stack, a first opening etched in the dielectric layer, which exposes a surface of the high resistivity layer, a third and fourth conductive layer deposited over the first opening in the dielectric layer and a portion of the first passivation layer, and a second passivation layer deposited over a portion of the fourth conductive layer, the second passivation layer having a first opening to expose a surface of the fourth conductive layer.

In another embodiment, the present invention is a semiconductor device, comprising a substrate having a first metal layer disposed on a top surface of the substrate, a high resistivity layer formed over the substrate and a portion of the first metal layer, a dielectric layer formed over the substrate, the high resistivity layer and the first metal layer, a first passivation layer formed over the dielectric layer, a second metal layer formed over a portion of the first passivation layer, dielectric layer, high resistivity layer, and first metal layer to form a capacitor device, the second metal layer serving as a top electrode of the capacitor device, a third and a fourth metal layer deposited over a portion of the first passivation layer, and a second passivation layer formed over a portion of the fourth metal layer, the second passivation layer having an opening to expose a surface of the fourth metal layer.

In still another embodiment, the present invention is a method of manufacturing a semiconductor device, comprising providing a substrate having a first conductive layer disposed on a top surface of the substrate, providing a high resistivity layer formed over the substrate and the first conductive layer, providing a dielectric layer deposited over the substrate, first conductive layer and high resistivity layer, wherein a portion of the dielectric layer, high resistivity layer, and first conductive layer forms a capacitor stack, providing a first passivation layer formed over the dielectric layer, providing a second conductive layer formed over the capacitor stack, providing a first opening etched in the dielectric layer, which exposes a surface of the high resistivity layer, providing a third and fourth conductive layer deposited over the first opening in the dielectric layer and a portion of the first passivation layer, and providing a second passivation layer deposited over a portion of the fourth conductive layer, the second passivation layer having a first opening to expose a surface of the fourth conductive layer.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

A semiconductor device having an integrated passive capacitor device can be manufacture which serves to alleviate the problem of non-uniformity in dimension, and better controlled capacitance, resulting in overall higher repeatability. Moreover, the semiconductor device can be manufactured using less process steps, which contributes to shorter cycle time and lower overall cost. In addition, a lithography step is eliminated in the manufacturing process, which reduces overall cost even further.

Passive devices such as a capacitor device, which will be further described in detail, can be combined with other passive devices, such as resistors, transceivers, receivers, BALUNs, and filter devices to constitute the semiconductor device. In one embodiment, a capacitor device can be interconnected with an inductor device as will be later described. A variety of passive components can be interconnected, however, to suit a particular application.

Figure 3:
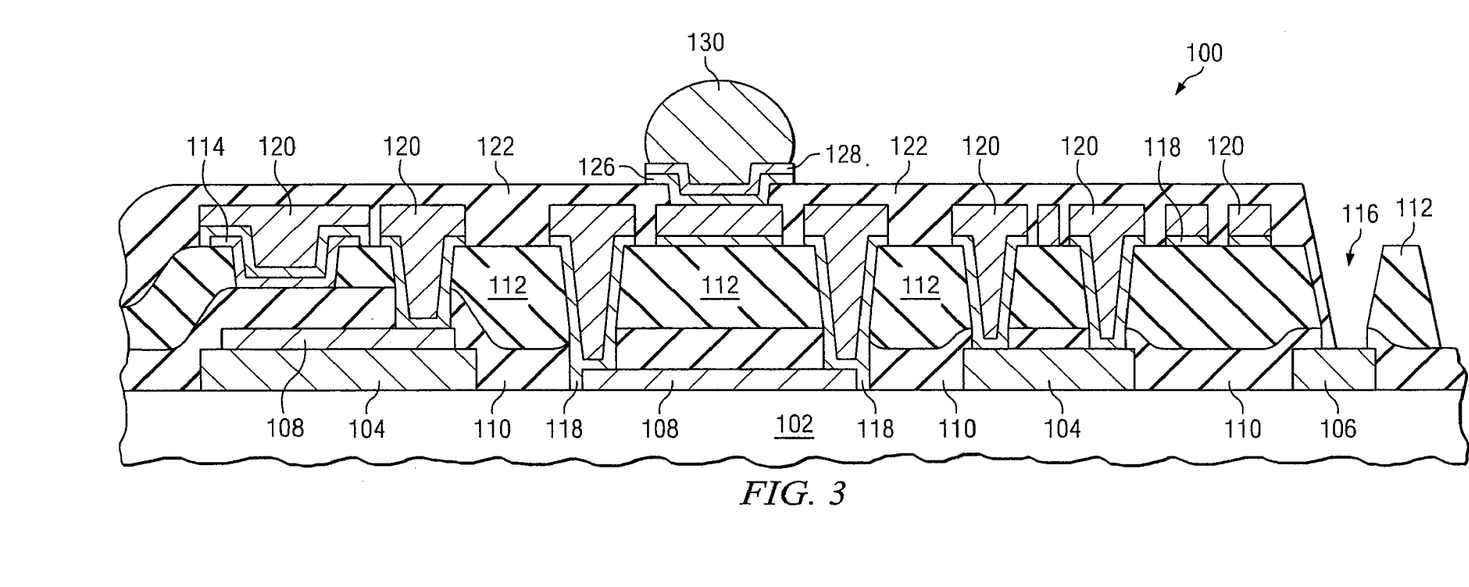
FIG. 3 illustrates an example first embodiment of a semiconductor device.

Turning to FIG. 3, a semiconductor device 100 manufactured according to various aspects of the present invention is illustrated. Device 100 includes a substrate 102, over which a first conductive layer 104 is disposed. A WB pad 106 is also optionally disposed over the substrate 102 as shown. A high resistivity layer 108 is disposed above the first conductive layer 104 and a portion of the center of the substrate 102 as shown. A dielectric layer 110 is formed above the high resistivity layer 108. A first passivation layer 112 is disposed above the dielectric layer.

In a departure from the prior art, a thin, second conductive layer 114 is deposited and patterned after the passivation layer 112 has been formed. Layer 114 serves as a top electrode of a capacitor device. A third and fourth conductive layer 118, 120 are formed over the electrode 114. A second passivation layer 122 is formed over the foregoing components. An opening is maintained to expose the fourth conductive layer for electrical connectivity. In one embodiment, the dielectric layer 110 above the WB pad 106 is etched to expose a surface 124 of the WB pad for electrical connectivity. Fifth and sixth conductive layers 126 and 128 are disposed above the opening. Finally, a bump 130 is connected to the layer 128.

Semiconductor device 100 has several features which innovate over the prior art device 10, including the patterning of a thin conductive layer 114 after the deposition of the first passivation layer 112. In addition, the dielectric layer 110 can be patterned with the first passivation layer as a hard mask. This patterning can occur after the second conductive layer 114 is deposited, which cuts out a fabrication step and lowers cost. A dimension of the top capacitor electrode 114 can be defined by the design and/or lithography of the thin first passivation layer 112. By using the passivation layer 112, the top electrode 114 is prevented from being over-etched. The patterning of the first passivation layer 112 is generally better controlled than the second conductive layer 114 patterning with prior art wet etching as only lithography is involved to define the size of the top electrode 114.

The respective lithography of the dielectric layer 110 having positive resist can be removed after using the first passivation layer 112 as the hard mask, which saves fabrication cost. In addition, conductive layer 114 can be made optional if tolerances of capacitances are not limited for a particular application.

Figure 4A:
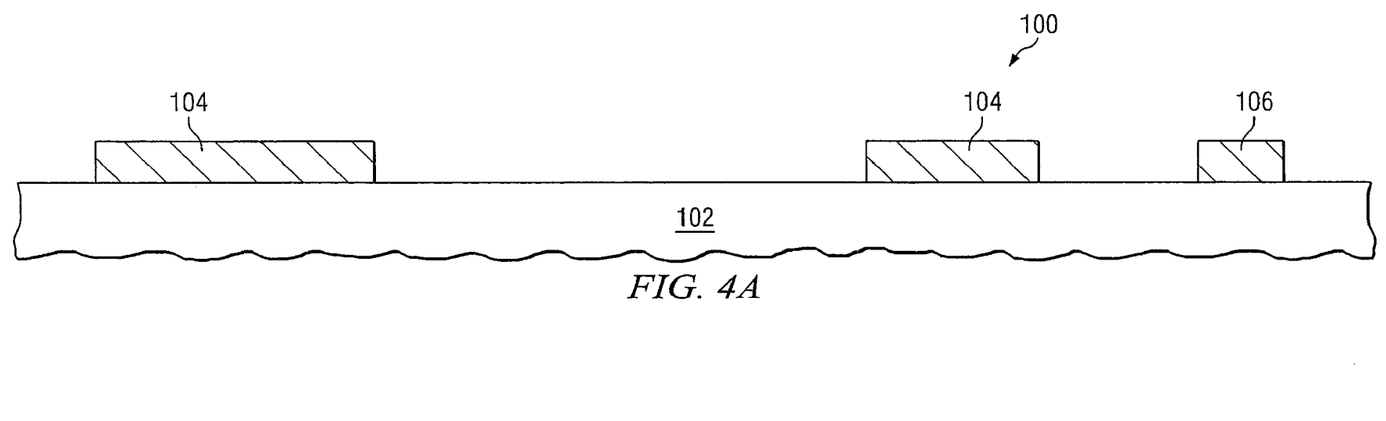
FIG. 4A illustrates a first step in an example method of manufacturing a semiconductor device.

Turning to FIG. 4A a first step in an example method of manufacturing a semiconductor device 100 is depicted in accordance with the present invention. A substrate 102 is provided. A first conductive layer 104 is deposited and patterned. The materials used in the layer 104 can include aluminum (Al), aluminum alloys, copper (Cu), gold (Au), silicide and polysilicon materials. An optional WB pad 106 is also disposed over the substrate 102.

Figure 4B:
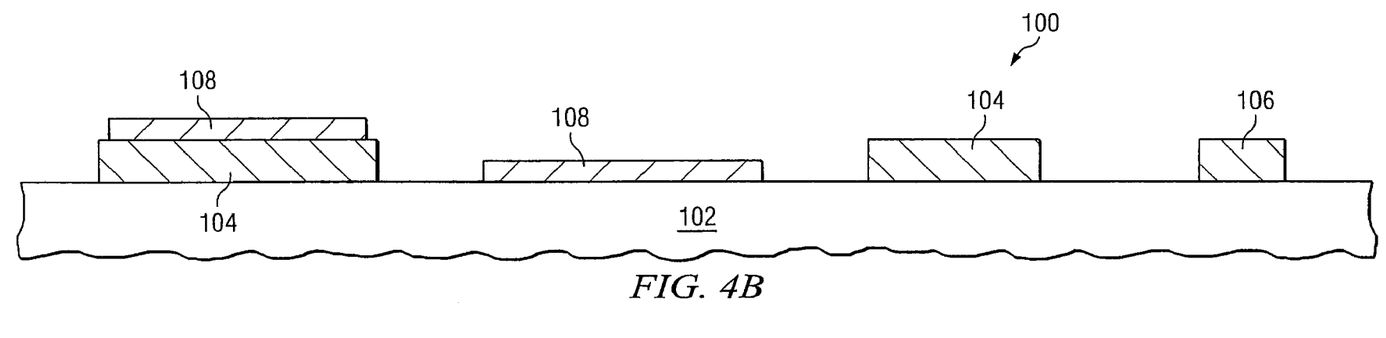
FIG. 4B illustrates a second step in an example method of manufacturing a semiconductor device.

FIG. 4B shows the deposition and patterning of a high resistivity layer 108, which is disposed over the layer 104 and a portion of the substrate 102 as shown. The high resistivity layer can be nickel-chromium (Ni—Cr), polysilicon, and other materials having a high resistance.

Figure 4C:
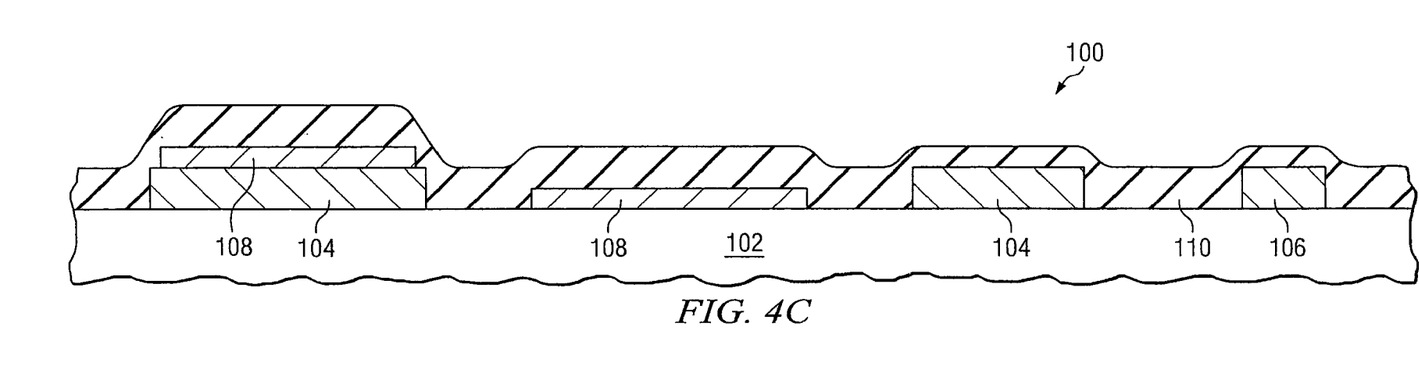
FIG. 4C illustrates a third step in an example method of manufacturing a semiconductor device.

FIG. 4C illustrates the deposition of a dielectric layer 110 over the high resistivity layer 108, conductive layer 104, and substrate 102 as shown. The dielectric layer can be composed of such materials as silicon nitride (SiN), tantalum oxide ($Ta_2O_5$), hafnium oxide ($HfO_2$), or a dielectric film material. The dielectric layer 110, high resistivity layer 108, and conductive layer 104 form various subcomponents of a capacitor stack.

Figure 4D:
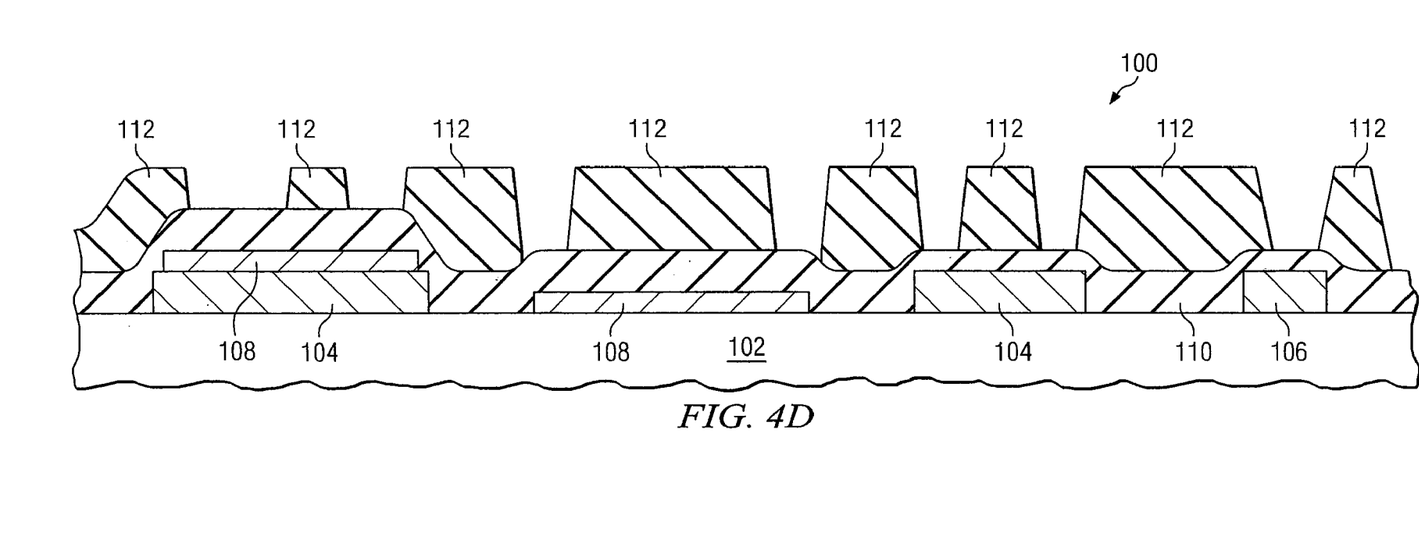
FIG. 4D illustrates a fourth step in an example method of manufacturing a semiconductor device.

FIG. 4D illustrates the forming of a first passivation layer 112 which is patterned and formed as shown over the layer 110. The passivation layer 112 can include an insulation material including polyimide, benzocyclobutene (BCB), or lead oxide (PbO).

Figure 4E:
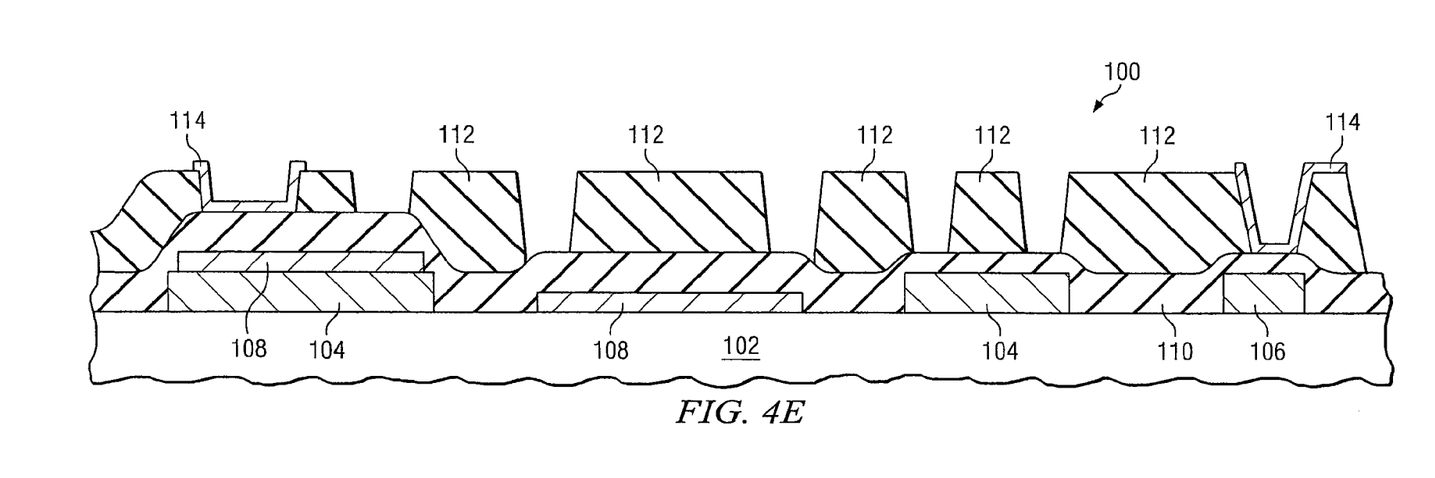
FIG. 4E illustrates a fifth step in an example method of manufacturing a semiconductor device.

FIG. 4E illustrates the deposition and patterning of a thin, second conductive layer 114 which is deposited over the capacitor stack as shown. Again, the deposition of layer 114 occurs after the patterning and deposition of the passivation layer 112. The patterning of layer 114 over the depicted WB pad 106 is optional. Materials such as aluminum (Al) and aluminum alloys can be used. Layer 114 becomes the top electrode of a capacitor device integrated into device 110.

Figure 4F:
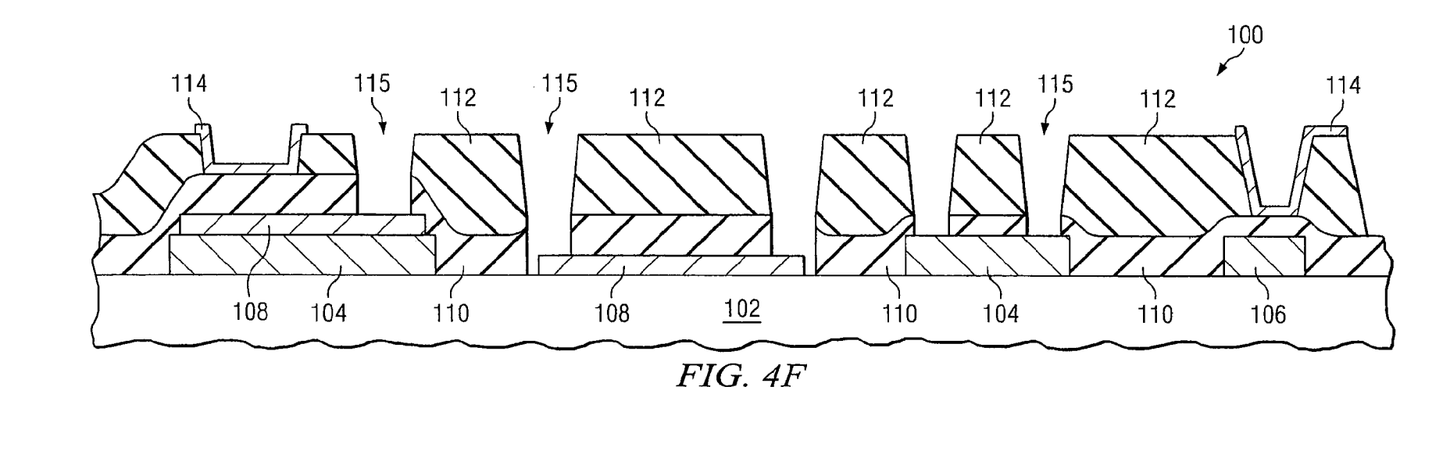
FIG. 4F illustrates a sixth step in an example method of manufacturing a semiconductor device.

The first passivation layer 112 is then used as the hard mask to etch the dielectric layer 110 as shown in FIG. 4F, which saves in production costs and fabrication steps.

Figure 4G:
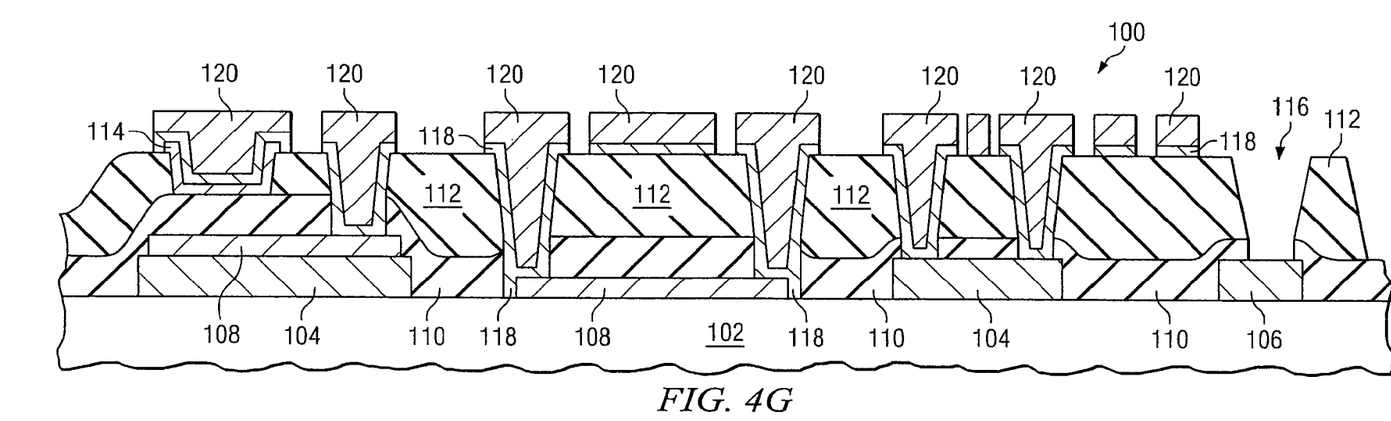
FIG. 4G illustrates a seventh step in an example method of manufacturing a semiconductor device.

FIG. 4G illustrates the deposition and patterning of a third and fourth conductive layer 118 and 120 which are formed over the layer 114 and elsewhere as depicted. The layer 118 can include such materials as titanium (Ti), titanium tungsten (TiW), chromium (Cr), tantalum (Ta), and tantalum nitride (TaN). The layer 120 can include such materials as aluminum (AL), aluminum alloy, copper (Cu), and gold (Au). An opening 116 exposes a surface of the dielectric layer 110 as shown.

Figure 4H:
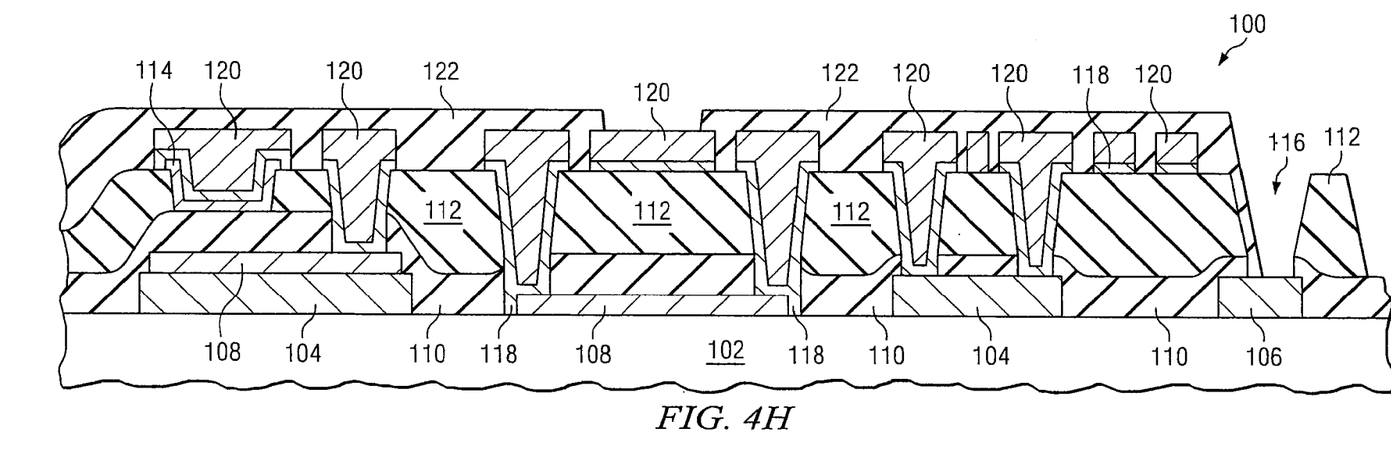
FIG. 4H illustrates an eighth step in an example method of manufacturing a semiconductor device.

FIG. 4H illustrates the deposition and patterning of a second passivation layer 122. Again, the passivation layer can include an insulation material including polyimide, benzocyclobutene (BCB), or lead oxide (PbO). Layer 122 can terminate on the first passivation layer 112 or the layer 122 can terminate on the WB pad 106. An opening 123 is formed in the passivation layer 122 to expose a surface of the conductive layer 120 and provide electrical connectivity.

Figure 4I:
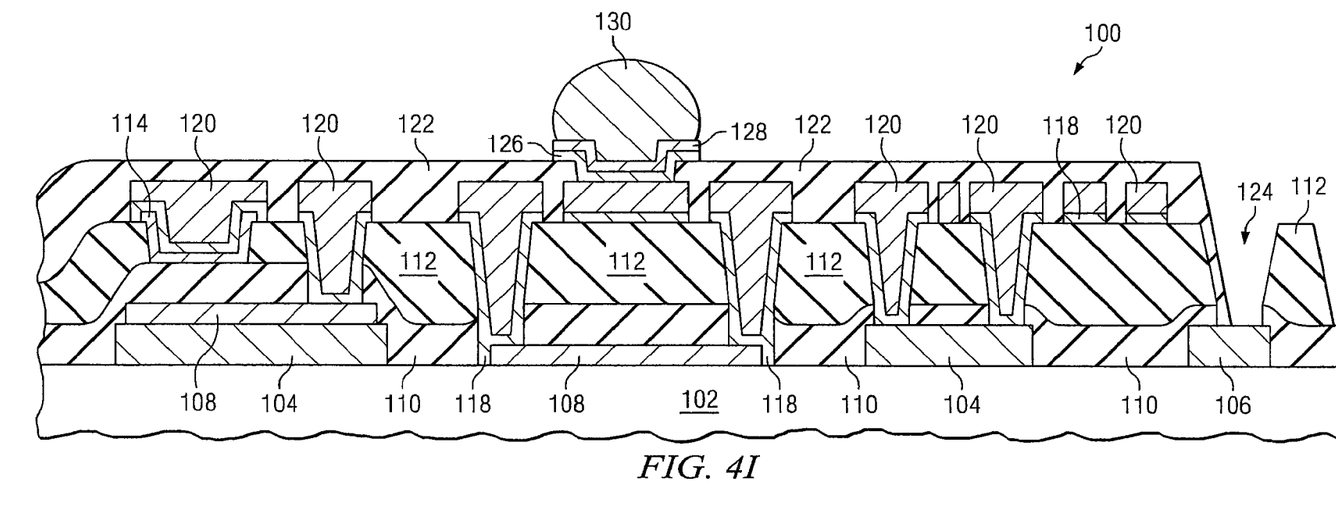
FIG. 4I illustrates a final, ninth step in an example method of manufacturing a semiconductor device.

Dielectric layer 110 over the WB pad 106 can be etched after completing the second passivation layer 122 to expose a surface of the WB pad 106 via opening 124 to suit a particular application as shown in FIG. 4I. As a next step, fifth and sixth conductive layers 126 and 128 are deposited over the opening 123 to provide electrical connectivity. The fifth conductive layer 126 can include such materials as titanium (Ti), titanium tungsten (TiW), aluminum (Al), aluminum alloy, and chromium (Cr). The sixth conductive layer 128 can include such materials as copper, copper/nickel vanadate (cu/NiV), gold/nickel (Au/Ni), and chromium/copper/copper (CrCu/Cu).

A bump 130, which can include a solder bump, gold (Au) bump, or copper (Cu) pillar structures is then formed over the layer 128 as shown. In one embodiment, the WB pad 106 can be protected during solder reflow, flux stripping, or other chemical processes.

Figure 5A:
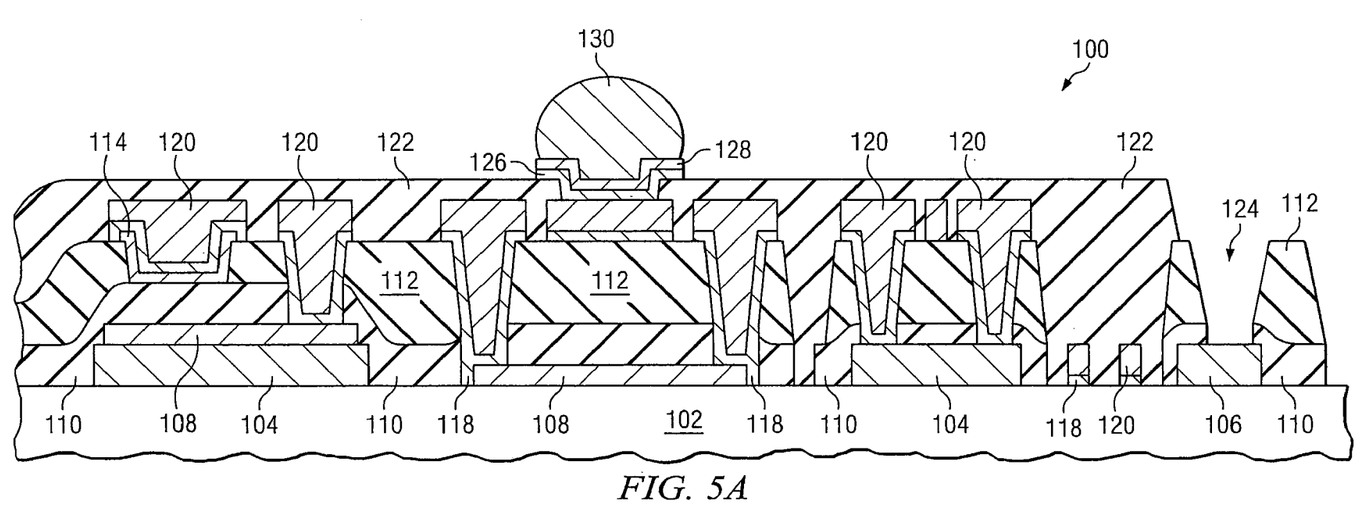
FIG. 5A illustrates an example second embodiment of a semiconductor device.

Turning to FIG. 5A, a second embodiment of a semiconductor device 100 is shown. Device 100 again includes a substrate 102. A first metal layer 104 is disposed over the substrate 102. The first metal layer can include an aluminum-copper (AlCu) material.

A WB pad 106 is disposed above the substrate as shown. A high resistivity layer 108 is disposed above a portion of the substrate 102 and metal layer 104. The layer 108 can include a tantalum silicide (TaSi) material. A dielectric layer 110 is disposed above the layers 108, 106, and 104. The dielectric layer can include a silicon nitride ($Si_3N_4$) material.

A first passivation layer 112 such as a polyimide material is deposed as shown. The layer 112 is patterned to leave an opening to expose a surface of the dielectric layer 110 in order to receive a thin, second metal layer 114 is shown. Again, layer 114 is deposited over a capacitor stack. Layer 114 can include an aluminum-copper (Al—Cu) material. Again, in a departure from the prior art, the layer 114 is deposited and patterned after the polyimide layer 112 is cured. Layer 114 serves as the top electrode of the capacitor device and is only patterned on the capacitor top plate, accordingly. Layer 114 is used partially to avoid any ion milling on the deposited dielectric layer 110.

Again, in a departure from the prior art, the dielectric layer 110 is patterned with the polyimide layer 112 as a hard mask after the second metal layer 114 is patterned. Such an approach again serves to eliminate a fabrication step and provides efficiency in manufacturing.

A third metal layer 118 and a fourth metal layer 120 are deposited. In one embodiment, titanium (Ti) can be incorporated into the layer 118 and copper (Cu) can be incorporated into the layer 120. A second polyimide layer 122 is formed as shown, leaving an opening to receive fifth and sixth conductive layers 126 and 128. Layer 126 can be composed of a titanium (Ti) material. Layer 128 can be composed of a nickel vanadium (NiV)/copper (Cu) material, respectively.

Layer 110 can be again etched to leave an opening 124 to expose a surface of the WB pad 106. A bump 130 is formed over layer 128 as shown to provide electrical connectivity.

Figure 5B:
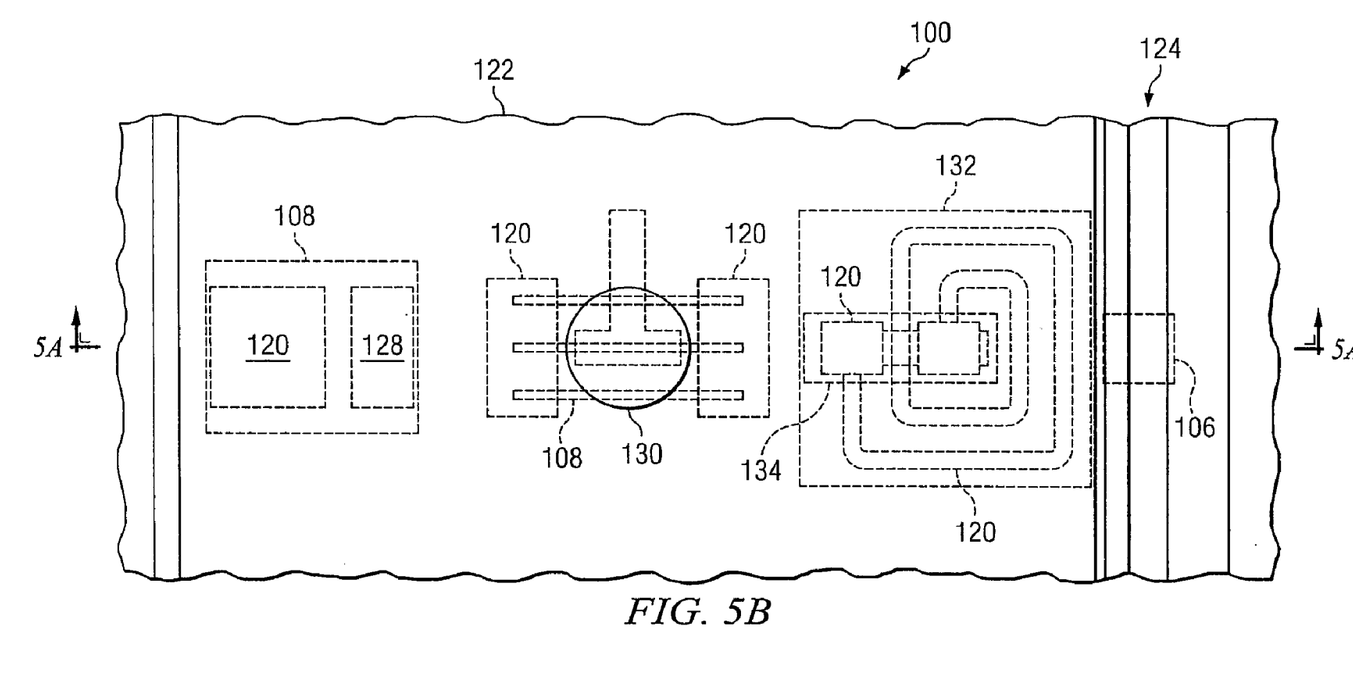
FIG. 5B illustrates a top view of an embodiment of a semiconductor device.

FIG. 5B illustrates a top view of a semiconductor device 100 as depicted in FIG. 5A. Again, such structures as bump 130, layers 122 and 120 are shown. The depicted passive spiral inductor device 132 includes a portion of metal layer 120 which has been patterned in a spiral shape. In the depicted embodiment, a nitride such as silicon nitride (SiN) is not found underneath the inductor device 132, except for the bridge portion 134, so as not to affect the performance of the inductor device 132.

Semiconductor devices 100 in the various embodiments shown can be manufactured using tools and equipment commonly known in the art, such as wire bonding, patterning, etching and similar equipment. Devices 100 serve to continue to advance integrated passive device technology at reduced fabrication cost, while resulting in larger overall repeatable quality.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of manufacturing a semiconductor device, comprising:
   providing a substrate;
   forming a first conductive layer over a top surface of the substrate;
   forming a resistive layer over the substrate and the first conductive layer;

forming a dielectric layer over the substrate, first conductive layer and resistive layer;
forming a first passivation layer over the dielectric layer;
removing first and second separate portions of the first passivation layer to expose first and second portions of the dielectric layer;
forming a second conductive layer in direct contact with the first portion of the dielectric layer after forming the first passivation layer, wherein the dielectric layer, resistive layer, first conductive layer, and second conductive layer operate as a capacitor;
etching a first opening in the second portion of the dielectric layer as defined by the removed second separate portion of the first passivation layer to expose a surface of the resistive layer;
forming a third conductive layer over the second conductive layer and a portion of the first passivation layer;
forming a fourth conductive layer over the third conductive layer; and
forming a second passivation layer over the fourth conductive layer and first passivation layer.

2. The method of manufacturing of claim 1, further including:
removing a portion of the second passivation layer to expose the fourth conductive layer;
forming a fifth conductive layer over of the fourth conductive layer in the removed portion of the second passivation layer; and
forming a sixth conductive layer over the fourth conductive layer to provide electrical connectivity.

3. The method of manufacturing of claim 2, wherein the fifth and sixth conductive layers operate as an under-bump metallurgy (UBM) structure to provide electrical connectivity.

4. The method of manufacturing of claim 2, further including forming a bump over the sixth conductive layer to provide electrical connectivity.

5. The method of manufacturing of claim 4, wherein the bump further comprises a solder bump, gold (Au) bump, or a copper (Cu) pillar structure.

6. The method of manufacturing of claim 1, further including forming a wire-bonding (WB) pad over the substrate.

7. The method of manufacturing of claim 6, further including forming the second conductive layer over the WB pad.

8. The method of manufacturing of claim 7, wherein the second passivation layer terminates on a portion of the first passivation layer or on a portion of the second conductive layer over the WB pad.

9. The method of manufacturing of claim 1, wherein a dimension of the second conductive layer is defined by a lithography of the first passivation layer to limit over etching of the second conductive layer.

10. The method of manufacturing of claim 1, wherein the first passivation layer is used as a hard mask to etch the first opening in the dielectric layer.

11. A method of manufacturing a semiconductor device, comprising:
providing a substrate;
forming a first conductive layer over the substrate;
forming a resistive layer over a portion of the first conductive layer;
forming a dielectric layer over the resistive layer;
forming a first passivation layer over the dielectric layer, first conductive layer, and substrate;
removing first and second separate portions of the first passivation layer to expose first and second portions of the dielectric layer;
forming a second conductive layer over the first portion of the dielectric layer after forming the first passivation layer; and
etching a first opening in the second portion of the dielectric layer as defined by the removed second separate portion of the first passivation layer to expose a surface of the resistive layer.

12. The method of claim 11, further including:
forming a third conductive layer over the second conductive layer and a portion of the first passivation layer;
forming a fourth conductive layer over the third conductive layer; and
forming a second passivation layer over the fourth conductive layer and first passivation layer.

13. The method of claim 12, further including:
removing a portion of the second passivation layer to expose the fourth conductive layer;
forming a fifth conductive layer over the fourth conductive layer; and
forming a sixth conductive layer over the fifth conductive layer.

14. The method of claim 13, wherein the fifth and sixth conductive layers operate as an under-bump metallurgy structure to provide electrical connectivity.

15. The method of claim 13, further including forming a bump formed over the sixth conductive layer to provide electrical connectivity.

16. The method of claim 11, wherein the dielectric layer, resistive layer, first conductive layer, and second conductive layer operate as a capacitor.

17. The method of claim 11, wherein a dimension of the second conductive layer is defined by a lithography of the first passivation layer to limit over etching of the second conductive layer.

18. The method of claim 11, wherein the removed second separate portion of the first passivation layer is used as a hard mask to etch the first opening in the dielectric layer.

19. A method of manufacturing a semiconductor device, comprising:
providing a substrate;
forming a first conductive layer over the substrate;
forming a resistive layer over a portion of the first conductive layer;
forming a dielectric layer over the resistive layer;
forming a first passivation layer over the dielectric layer;
removing a first portion of the first passivation layer to expose a first portion of the dielectric layer; and
forming a second conductive layer over the first portion of the dielectric layer after forming the first passivation layer.

20. The method of claim 19, further including:
removing a second portion of the first passivation layer separate from the first portion of the first passivation layer to expose a second portion of the dielectric layer; and
etching a first opening in the second portion of the dielectric layer as defined by the removed second portion of the first passivation layer to expose a surface of the resistive layer.

21. The method of claim 20, further including:
forming a third conductive layer over the second conductive layer and a portion of the first passivation layer;
forming a fourth conductive layer over the third conductive layer; and
forming a second passivation layer over the fourth conductive layer and first passivation layer.

22. The method of claim 21, further including:
removing a portion of the second passivation layer to expose the fourth conductive layer;
forming a fifth conductive layer over the fourth conductive layer; and
forming a sixth conductive layer over the fifth conductive layer.

23. The method of claim 19, wherein the dielectric layer, resistive layer, first conductive layer, and second conductive layer operate as a capacitor.

24. The method of claim 19, wherein a dimension of the second conductive layer is defined by a lithography of the first passivation layer to limit over etching of the second conductive layer.

25. The method of claim 19, wherein the removed second portion of the first passivation layer is used as a hard mask to etch the first opening in the dielectric layer.

* * * * *